US012685157B2

(12) United States Patent
Cheng et al.

(10) Patent No.: US 12,685,157 B2
(45) Date of Patent: Jul. 14, 2026

(54) ETCHING-DAMAGE-FREE INTERMETAL DIELECTRIC LAYER WITH THERMAL DISSIPATION FEATURE

(71) Applicant: TAIWAN SEMICONDUCTOR MANUFACTURING COMPANY, LTD., Hsinchu (TW)

(72) Inventors: Kai-Fang Cheng, Hsinchu (TW); Cherng-Shiaw Tsai, Hsinchu (TW); Cheng-Chin Lee, Hsinchu (TW); Yen-Ju Wu, Hsinchu (TW); Yen-Pin Hsu, Hsinchu (TW); Li-Ling Su, Hsinchu (TW); Ming-Hsien Lin, Hsinchu (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 547 days.

(21) Appl. No.: 18/170,933

(22) Filed: Feb. 17, 2023

(65) Prior Publication Data

US 2024/0087980 A1 Mar. 14, 2024

Related U.S. Application Data

(60) Provisional application No. 63/404,730, filed on Sep. 8, 2022.

(51) Int. Cl.
*H10W 40/25* (2026.01)
*H10P 14/694* (2026.01)
(Continued)

(52) U.S. Cl.
CPC ..... *H10W 40/253* (2026.01); *H10P 14/69433* (2026.01); *H10W 20/056* (2026.01);
(Continued)

(58) Field of Classification Search
CPC ............ H01L 23/5329; H01L 23/5226; H01L 23/3738; H01L 21/0217; H01L 21/4871;
(Continued)

(56) References Cited

U.S. PATENT DOCUMENTS 6,016,012 A * 1/2000 Chatila ............. H01L 23/53223
438/668
2006/0038297 A1* 2/2006 Usami ................... H01L 23/562
257/E23.142
(Continued)

OTHER PUBLICATIONS

Stabler et al. , "Thermal Properties of SiOC Glasses and Glass Ceramics at Elevated Temperatures", published Feb. 10, 2018.*

*Primary Examiner* — John M Parker
(74) *Attorney, Agent, or Firm* — Birch, Stewart, Kolasch & Birch, LLP

(57) ABSTRACT

A semiconductor device includes a substrate, a dielectric layer disposed over the substrate, and an interconnect structure extending through the dielectric layer. The dielectric layer includes a low-k dielectric material which includes silicon carbonitride having a carbon content ranging from about 30 atomic % to about 45 atomic %. The semiconductor device further includes a thermal dissipation feature extending through the dielectric layer and disposed to be spaced apart from the interconnect structure.

20 Claims, 11 Drawing Sheets

(51) Int. Cl.
*H10W 20/00* (2026.01)
*H10W 20/42* (2026.01)
*H10W 20/48* (2026.01)
*H10W 70/02* (2026.01)

(52) U.S. Cl.
CPC ........... *H10W 20/42* (2026.01); *H10W 20/48* (2026.01); *H10W 70/02* (2026.01)

(58) Field of Classification Search
CPC ........... H01L 21/76877; H10W 20/48; H10W 20/42; H10W 20/056; H10W 40/253; H10W 70/02; H10P 14/69433
See application file for complete search history.

(56) References Cited

U.S. PATENT DOCUMENTS

| 2020/0090930 A1* | 3/2020 | Hashimoto | ....... | C23C 16/45531 |
| 2021/0280409 A1* | 9/2021 | Yamashita | ........ | C23C 16/45534 |
| 2022/0081762 A1* | 3/2022 | Wu | ......................... | C23C 16/40 |
| 2022/0336213 A1* | 10/2022 | Hashimoto | ........... | C23C 16/045 |

* cited by examiner

100

ETCHING-DAMAGE-FREE INTERMETAL DIELECTRIC LAYER WITH THERMAL DISSIPATION FEATURE

REFERENCE TO RELATED APPLICATION

This application claims priority of U.S. Provisional Application No. 63/404,730 filed on Sep. 8, 2022, the contents of which is incorporated herein by reference in its entirety.

BACKGROUND

The integration density of various electronic components, such as transistors, diodes, resistors, capacitors, etc., is being improved continuously in the semiconductor industry by continual reduction in minimum feature sizes. As the feature sizes are reduced, the distance between metal features is continually reduced. As the distance between the metal features reduces, the resulting parasitic capacitance increases, leading to larger resistance-capacitance (RC) delay for an integrated chip. To improve performance and reduce the parasitic capacitance, materials having low dielectric constant (k) values are used.

Some materials having low k values (for example, silicon carboxide) might be damaged easily in an etching procedure of a single or dual damascene process for forming interconnect structures (for example, metal lines). In addition, such materials having low k values might impede thermal dissipation and cause thermal-related reliability issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
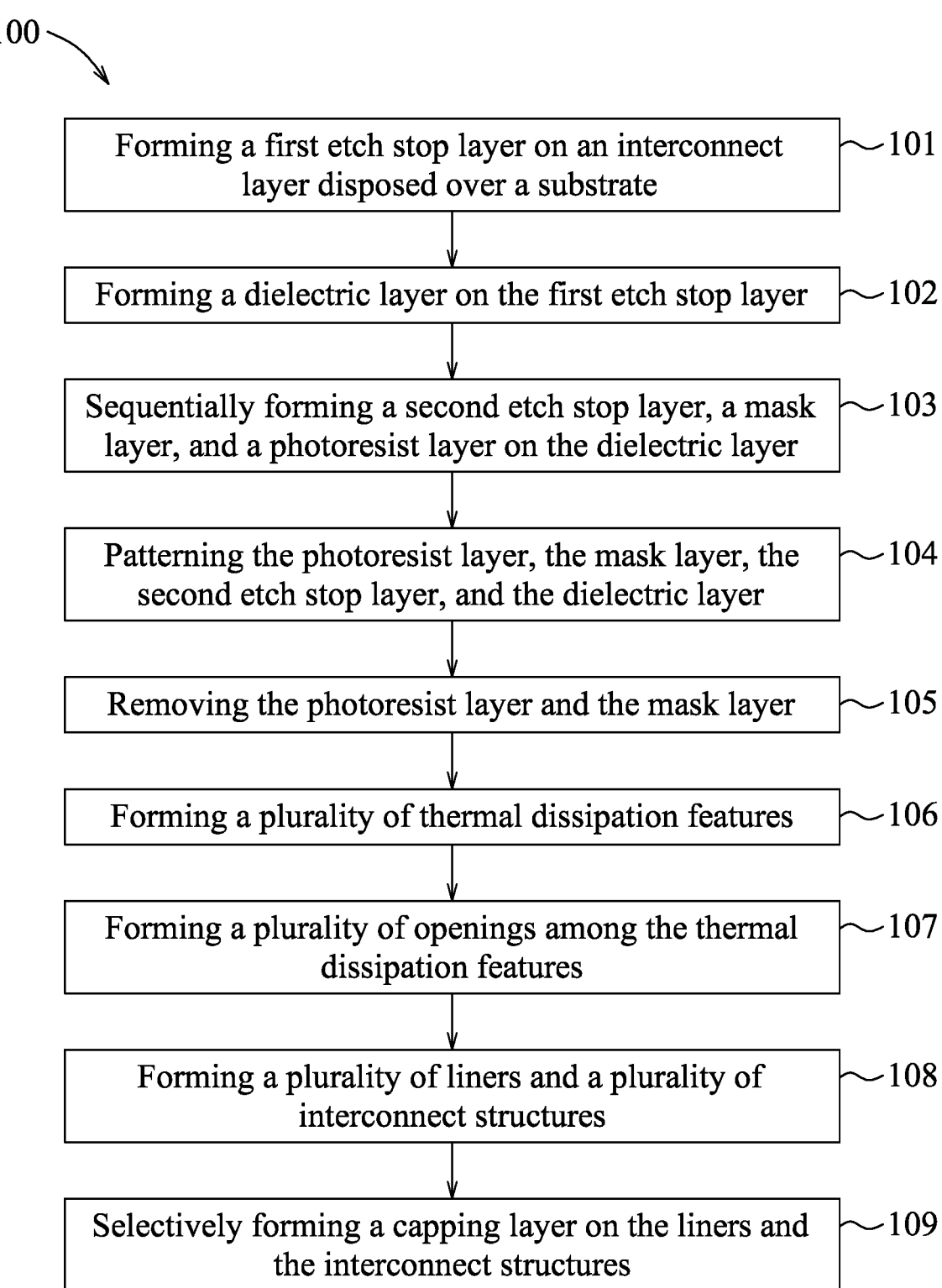
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "below," "upper," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device including an intermetal dielectric (IMD) layer which is substantially free of etching damage and which is formed with a thermal dissipation feature, and a method for manufacturing the semiconductor device. FIG. 1 is a flow diagram illustrating a method 100 for manufacturing a semiconductor device in accordance with some embodiments. FIGS. 2 to 10 are schematic views of some intermediate stages of the method 100 as depicted in FIG. 1 in accordance with some embodiments. Some portions are omitted in FIGS. 2 to 10 for the sake of brevity. Additional steps can be provided before, after or during the method 100, and some of the steps described herein may be replaced by other steps or be eliminated.

Figure 2:
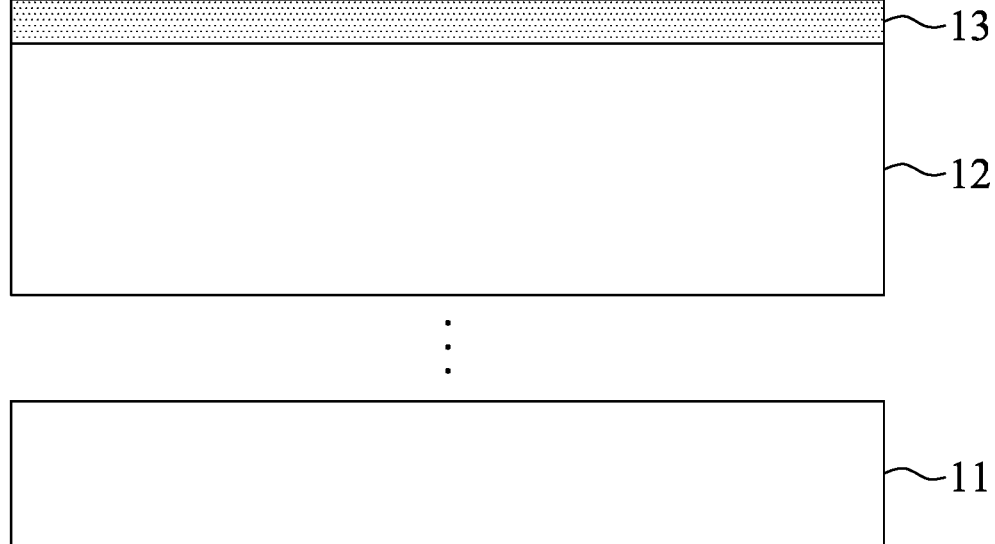
FIGS. 2 to 10 are schematic views showing some intermediate stages of the method depicted in FIG. 1.

Referring to FIG. 1 and the example illustrated in FIG. 2, the method 100 begins at step 101, where a first etch stop layer is formed on an interconnect layer disposed over a substrate. FIG. 2 is a schematic view illustrating formation of a first etch stop layer 13 on an interconnect layer 12, which is disposed over a substrate 11.

In some embodiments, the substrate 11 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure.

The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure. In some embodiments, the semiconductor substrate may further include various active regions, for example, the active regions configured for an N-type metal oxide semiconductor (NMOS) transistor device or the active regions configured for a P-type metal oxide semiconductor (PMOS) transistor device. In some embodiments, the active regions may includes source/drain (S/D) regions of a transistor device. It is noted that each of the source/drain regions may refer to a source or a drain, individually or collectively dependent upon the context.

In some embodiments, the interconnect layer 12 may include an etch stop layer (not shown) and a dielectric layer (not shown) disposed on the etch stop layer. In some embodiments, the etch stop layer may include, for example, but not limited to, silicon carbonitride (SiCxNy), aluminum nitride (AlNx), aluminum oxynitride (AlOxNy), aluminum oxide (AlOx), aluminum oxycarbide (AlOxCy), boron nitride (BNx), boron carbonitride (BCxNy), or combinations thereof, as long as the etch stop layer thus formed is a hermetic layer. Other suitable materials are within the contemplated scope of the present disclosure. In some embodiments, the dielectric layer may include a low dielectric constant (k) dielectric material having a k value ranging from about 2.0 to about 5.0. In some embodiments, the dielectric layer may include, for example, but not limited to, silicon oxide (SiOx), silicon carbide (SiCx), silicon carbonitride (SiCxNy), silicon carboxide (SiCxOy), hydrogenated silicon oxycarbide (SiOxCyHz), or combinations thereof. Other suitable low-k dielectric materials are within the contemplated scope of the present disclosure. In some embodiments, the dielectric layer may be formed by a suitable deposition process as is known in the art of semiconductor fabrication, for example, but not limited to, chemical vapor deposition (CVD), atomic layer deposition (ALD), spin coating, or the like. Other suitable deposition techniques are within the contemplated scope of the present disclosure. In some embodiments, the deposition process is conducted at a temperature ranging from about room temperature to about 425° C. In some embodiments, an annealing process, a plasma treatment process, or an ultraviolet (UV) treatment process may be conducted after the deposition process to remove dangling bonds in the dielectric layer and to form micropores in the dielectric layer.

In some embodiments, the interconnect layer 12 may serve as a dummy metal layer, and includes a plurality of metal lines disposed in the dielectric layer and spaced apart from each other. The dielectric layer thus serves as an IMD layer. In some alternative embodiments, the interconnect layer 12 may serve as a via layer, and includes at least one via contact for interconnecting at least one metal line of a metal layer to be formed on the interconnect layer 12 and at least one metal line of another metal layer formed below the interconnect layer 12. In some embodiments, the metal lines or the via contact may be formed using a single damascene process, a dual damascene process, or a semi-damascene process. In some embodiments, the metal lines or the via contact may include a metal material, for example, but not limited to, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), molybdenum (Mo), or the like, or alloys thereof, which have good conductivity. Other suitable conductive materials are within the contemplated scope of the present disclosure. Deposition of the metal material to form the metal lines or the via contact may be conducted by a suitable deposition process as is known to those skilled in the art of semiconductor fabrication (for example, but not limited to, CVD, ALD, physical vapor deposition (PVD), electroless deposition (ELD), electro-chemical plating (ECP), or the like) at a temperature ranging from about 200° C. to about 425° C.

In some embodiments, a capping layer (not shown) may be selectively formed on the metal lines or the via contact by a suitable selective deposition process as is known to those skilled in the art of semiconductor fabrication, for example, but no limited to, selective CVD, selective ALD, selective electroless deposition (ELD), or the like at a temperature ranging from about 200° C. to about 450° C. Other suitable techniques are within the contemplated scope of the present disclosure. In some embodiments, the capping layer may include, for example, but not limited to, graphene, metal (for example, but not limited to, Co, Al, Ru, W, Mo, Ta, Cu, Fe, Rh, Ir, Pd, Pt, or the like), alloys of the metals, silicides, nitrides, or oxides of the metals or the alloys. Other suitable materials are within the contemplated scope of the present disclosure.

The first etch stop layer 13 is a hermetic layer. In some embodiments, the first etch stop layer 13 may include, for example, but not limited to, aluminum nitride (AlNx), or the like. Other suitable materials are within the contemplated scope of the present disclosure. Aluminum nitride (AlNx) for forming the first etch stop layer 13 has a high thermal conductivity ranging from about 150 W/mK to about 200 W/mK. In some embodiments, the first etch stop layer 13 may be formed by a suitable deposition process as is known in the art of semiconductor fabrication, for example, but not limited to, CVD, ALD, PVD, or the like. Other suitable deposition techniques are within the contemplated scope of the present disclosure. In some embodiments, in which the first etch stop layer 13 includes aluminum nitride, the deposition process for forming the first etch stop layer 13 may be conducted by CVD or ALD using a first precursor containing aluminum and a second precursor containing nitrogen. In some embodiments, the first precursor includes, for example, but not limited to, trimethyl aluminum (Al $(CH_3)_3$), triethyl aluminum (Al$(C_2H_5)_3$), or the like, or combinations thereof. In some embodiments, the second precursor includes, for example, but not limited to, nitrogen gas ($N_2$), ammonia ($NH_3$), or the like, or combinations thereof. In some embodiments, in which PVD is conducted, the first etch stop layer 13 including aluminum nitride may be formed by sputtering an aluminum target in a nitrogen plasma formed from, for example, but not limited to, ammonia. In some embodiments, the first etch stop layer 13 including aluminum nitride may be further processed by a plasma treatment using an inert gas plasma (for example, but not limited to, helium plasma, argon plasma, or the like) to convert aluminum nitride from a polycrystalline state to a single crystalline state so as to improve thermal conductivity thereof.

Figure 3:
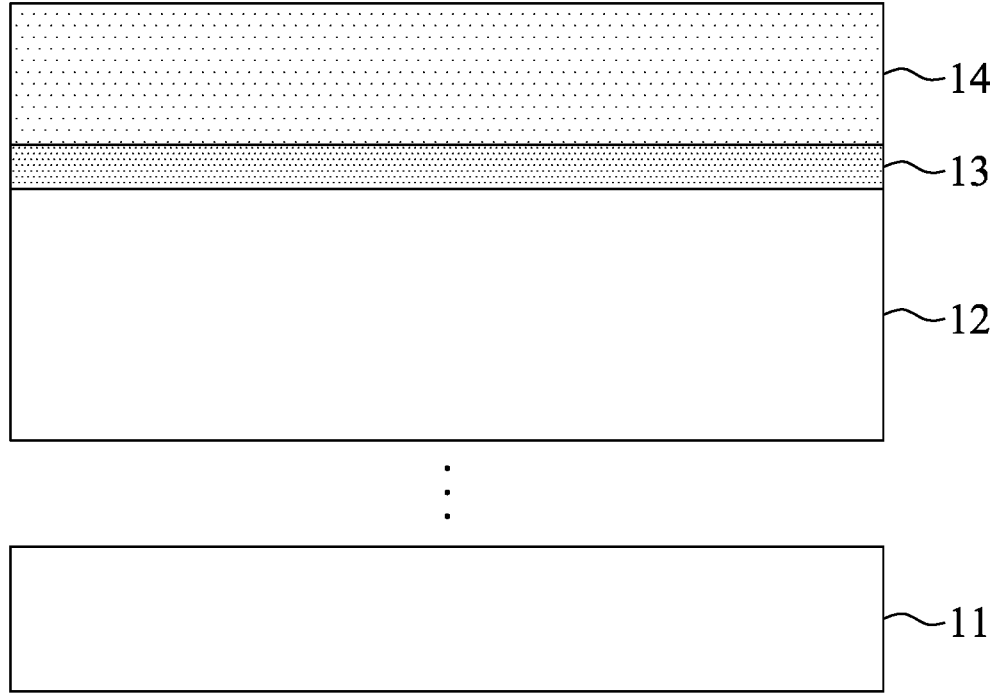

Referring to FIG. 1 and the example illustrated in FIG. 3, the method 100 proceeds to step 102, where a dielectric layer is formed on the first etch stop layer. FIG. 3 is a schematic view illustrating formation of a dielectric layer 14 on the first etch stop layer 13. In some embodiments, the dielectric layer 14 includes a low-k dielectric material which includes silicon carbonitride (SiCxNy) having a thermal conductivity ranging from about 0.6 W/mK to about 1.0 W/mK and a carbon content ranging from about 30 atomic % to about 45 atomic %. In some embodiments, the carbon content ranges from about 40 atomic % to about 45 atomic %. In some embodiments, the low-k dielectric material has a k value ranging from about 2.5 to about 4.0. In some embodiments, the dielectric layer 14 may be formed by a suitable deposition process as is known in the art of semiconductor fabrication, for example, but not limited to, CVD, ALD, or the like. Other suitable deposition techniques are within the contemplated scope of the present disclosure. In some embodiments, the deposition process is conducted at a temperature ranging from about 200° C. to about 425° C. If the deposition process is conducted at a temperature higher than 425° C., the components (for example, but not limited to, the metal lines disposed beneath the dielectric layer 14 may be damaged (for example, but not limited to, wiggling or bending of the metal lines).

In some embodiments, the deposition process for forming the dielectric layer 14 is conducted using a first precursor containing silicon and carbon and a second precursor containing nitrogen. In some embodiments, the first precursor includes for example, but not limited to, methylsilane, dimethylsilane, trimethylsilane, tetramethylsilane, methyldisilane, dimethyldisilane, trimethyl di silane, tetramethyldisilane, pentamethyldisilane, hexamethyldisilane, or combinations thereof. In some embodiments, the second precursor includes, for example, but not limited to, nitrogen gas ($N_2$), ammonia ($NH_3$), or a combination thereof. In some alternative embodiments, the deposition process for forming the dielectric layer 14 is conducted using a silicon-containing precursor, a carbon-containing precursor, and a nitrogen-containing precursor. In some embodiments, the silicon-containing precursor includes for example, but not limited to, silane, disilane, or the like, or combinations thereof, the carbon-containing precursor includes, for example, but not limited to, ethylene, or the like, and the nitrogen-containing precursor includes, for example, but not limited to, nitrogen gas ($N_2$), ammonia ($NH_3$), or a combination thereof. In some embodiments, an annealing process, a plasma treatment process, or an ultraviolet (UV) treatment process may be conducted after the deposition process to remove dangling bonds in the dielectric layer 14 and to form micropores in the dielectric layer 14.

Figure 4:
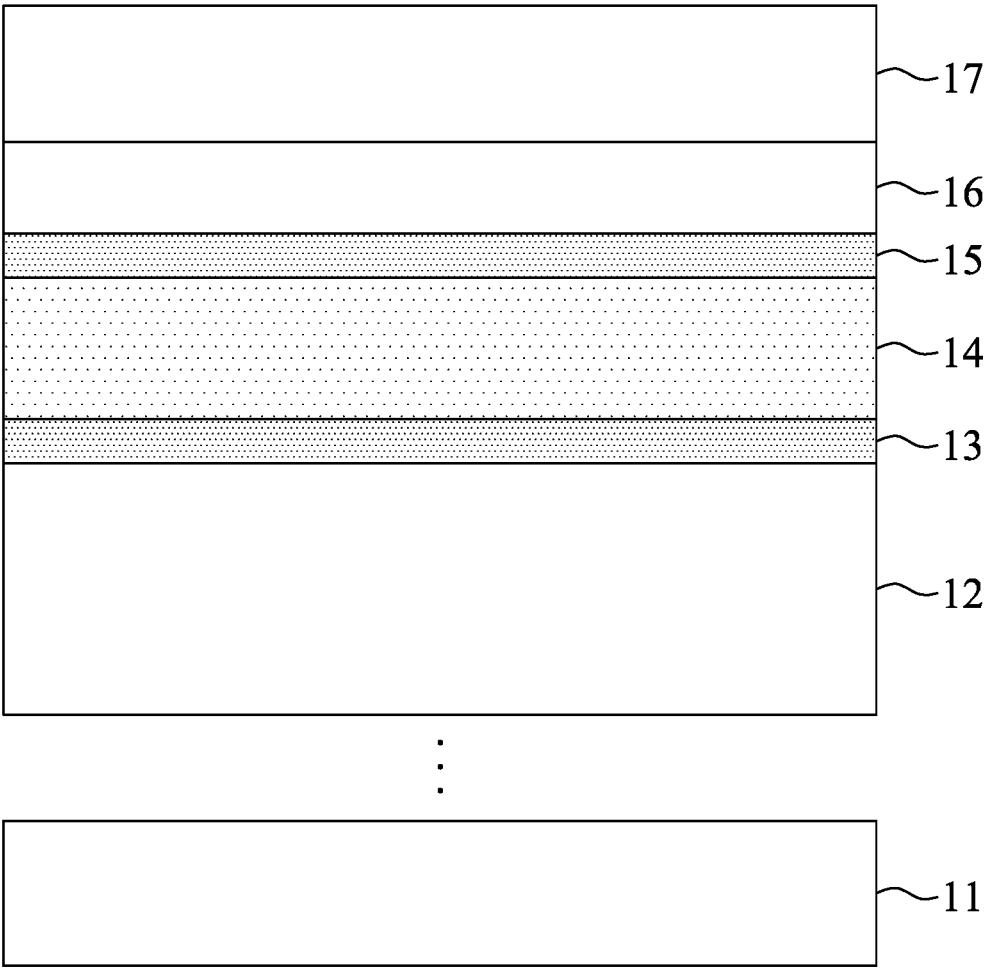

Referring to FIG. 1 and the example illustrated in FIG. 4, the method 100 proceeds to step 103, where a second etch stop layer, a mask layer, and a photoresist layer are formed on the dielectric layer, sequentially. FIG. 4 is a schematic view illustrating formation of a second etch stop layer 15, a mask layer 16, and a photoresist layer 17 on the dielectric layer 14, sequentially. In some embodiments, the second etch stop layer 15 is a hermetic layer, and may include, for example, but not limited to, aluminum nitride (AlNx), or the like. Other suitable materials are within the contemplated scope of the present disclosure. The process for forming the second etch stop layer 15 may be the same as or similar to that for forming the first etch stop layer 13 described above with reference to FIG. 2, and the details thereof are omitted for the sake of brevity. In some embodiments, the mask layer 16 (for example, a hard mask layer) may include, for example, but not limited to, an oxide compound (for example, but not limited to, silicon oxide (SiOx), or the like), a nitride compound (for example, but not limited to, titanium nitride (TiN), or the like), a carbide compound (for example, but not limited to, tungsten carbide (WC), or the like), or combinations thereof. Other suitable materials are within the contemplated scope of the present disclosure. The mask layer 16 may be formed on the second etch stop layer 15 by a suitable deposition process as is known in the art of semiconductor fabrication, for example, but not limited to, PVD, CVD, ALD, plasma enhanced ALD (PEALD), thermal ALD, plasma-enhanced CVD (PECVD), or the like, at a temperature ranging from about 200° C. to about 450° C. Other suitable techniques are within the contemplated scope of the present disclosure. The photoresist layer 17 is then formed on the mask layer 16 by a suitable fabrication technique known to those skilled in the art of semiconductor fabrication, for example, but not limited to, a spin-on technique. Other suitable techniques are within the contemplated scope of the present disclosure. In some embodiments, the photoresist layer 17 may include, for example, but not limited to, a hydrocarbon-based polymer. Other suitable materials are within the contemplated scope of the present disclosure.

Figure 5:
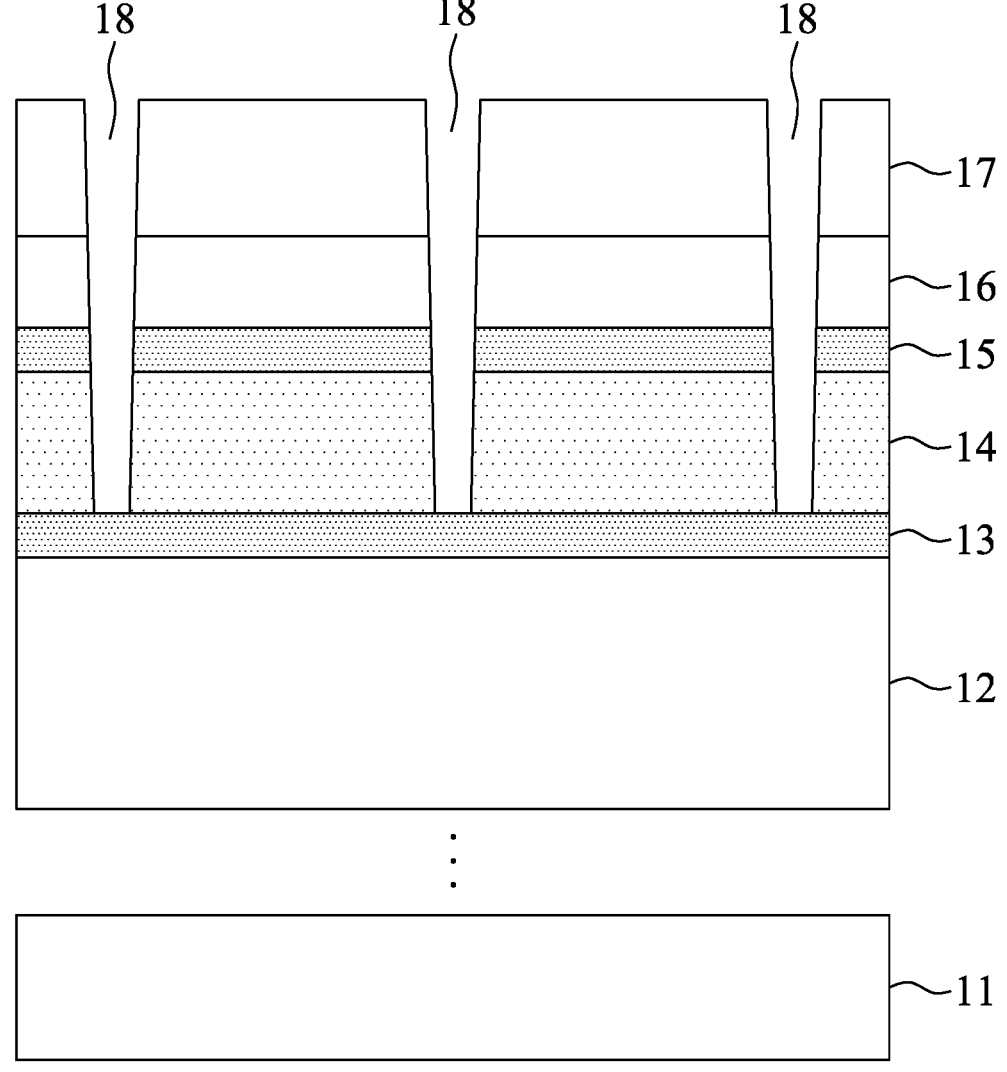

Referring to FIG. 1 and the example illustrated in FIG. 5, the method 100 proceeds to step 104, where the photoresist layer, the mask layer, the second etch stop layer, and the dielectric layer are patterned. The photoresist layer 17 is patterned using a suitable photolithography technique to form an opening pattern 18. For example, the photoresist layer 17 is exposed to light for patterning, followed by developing to form the opening pattern 18. The opening pattern 18 formed in the photoresist layer 17 is transferred to the mask layer 16, the second etch stop layer 15, and the dielectric layer 14 using one or more etching processes, for example, but not limited to, a wet etching process, a dry etching process, a reactive ion etching process, a neutral beam etching process, or the like, so as to expose portions of the first etch stop layer 13.

Figure 6:
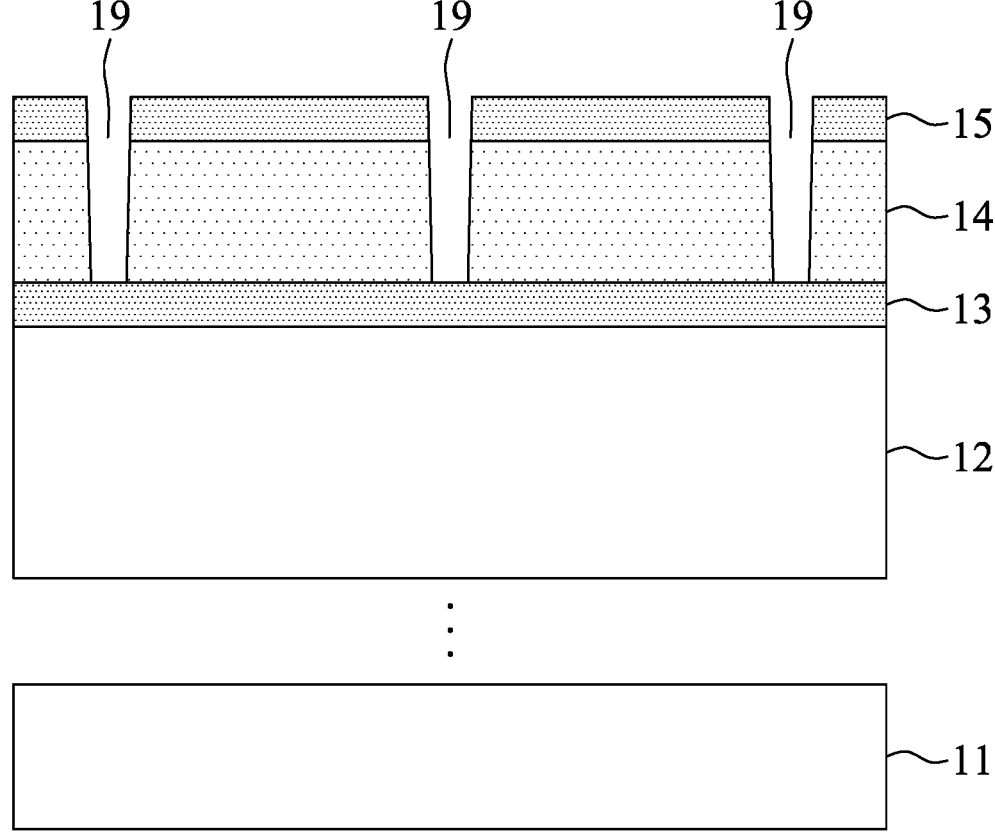

Referring to FIG. 1 and the examples illustrated in FIGS. 5 and 6, the method 100 proceeds to step 105, where the photoresist layer and the mask layer are removed. In some embodiments, the photoresist layer 17 and the mask layer 16 may be removed by one or more etching processes. For example, the photoresist layer 17 may be removed by a wet etching process, and the mask layer 16 may be removed by a dry etching process and a wet etching process. A plurality of openings 19 thus formed extend through the second etch stop layer 15 and the dielectric layer 14 to expose portions of the first etch stop layer 13.

Figure 7:
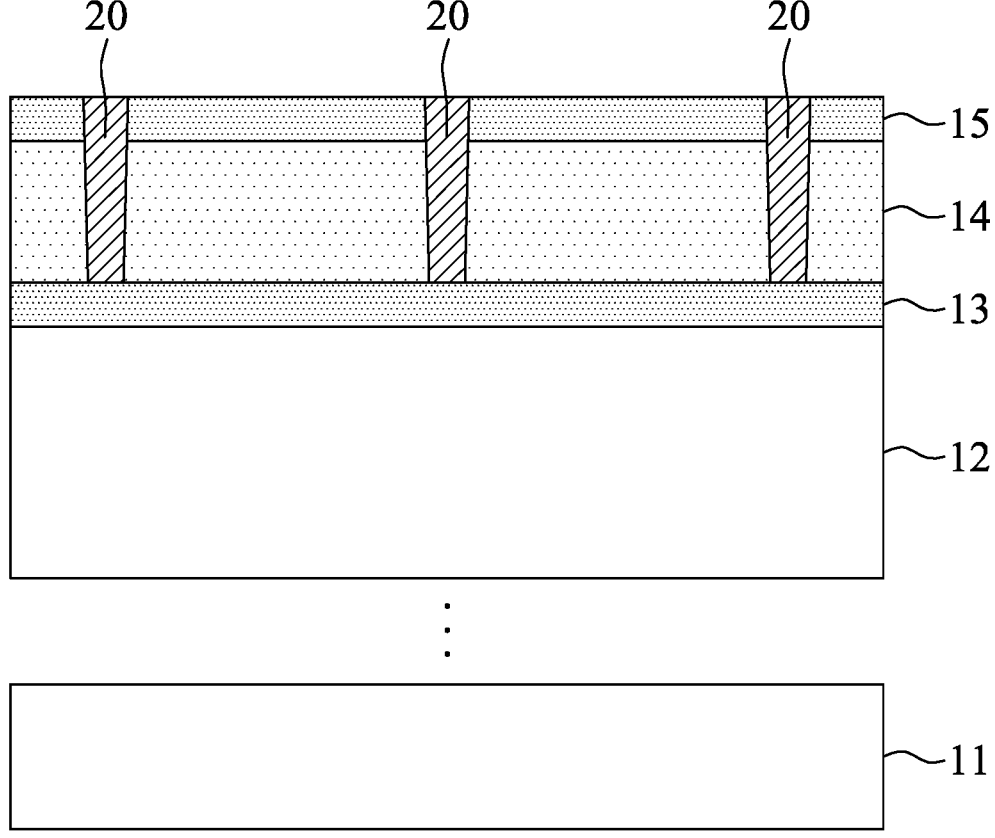

Referring to FIG. 1 and the example illustrated in FIGS. 6 and 7, the method 100 proceeds to step 106, where a plurality of thermal dissipation features are formed. A thermal conductive dielectric material is filled into the openings 19 by a suitable deposition process as is known to those skilled in the art of semiconductor fabrication (for example, but not limited to, CVD, PECVD, ALD, PEALD, spin coating, or the like) at a temperature ranging from about room temperature to about 450° C., and a planarization process (for example, but not limited to, a chemical mechanical planarization (CMP) process) is then conducted to remove excess of the thermal conductive dielectric material over the second etch stop layer 15 so as to form a plurality of thermal dissipation features 20, which extend through the second etch stop layer 15 and the dielectric layer 14 to be in contact with the first etch stop layer 13. In some embodiments, the thermal conductive dielectric material has a thermal conductivity ranging from about 1 W/mK to about 2 W/mK. In some embodiments, the thermal conductive dielectric material includes, for example, but not limited to, silicon oxide (SiOx), or the like.

Figure 8:
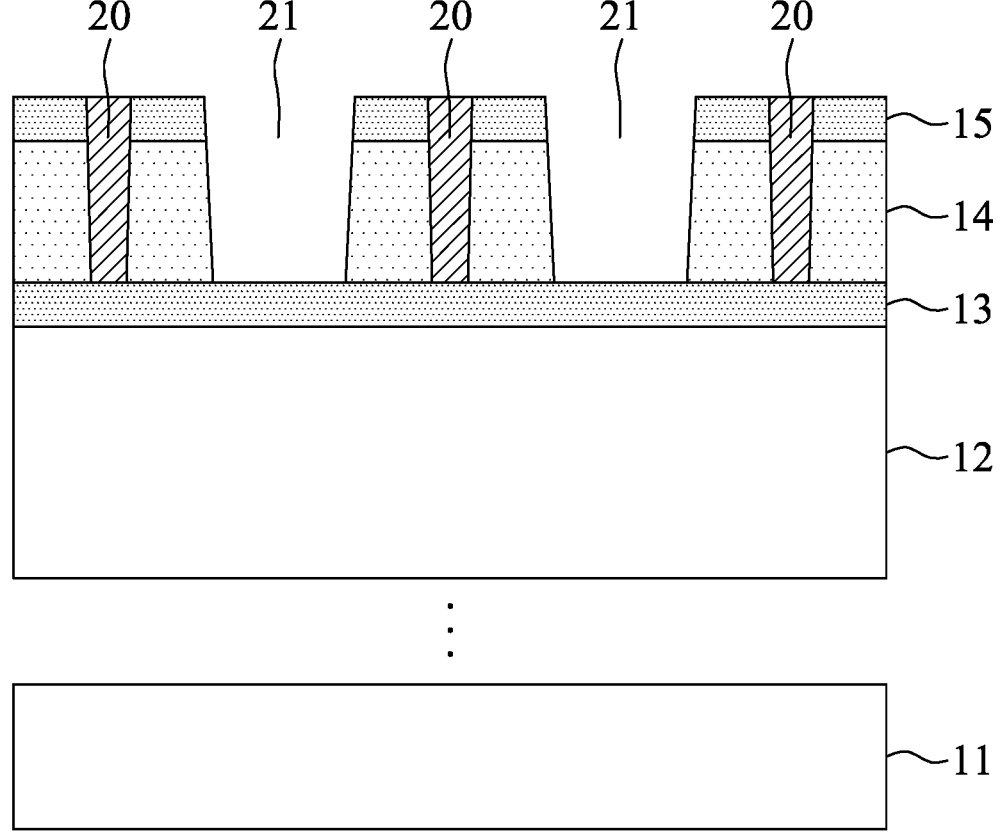

Referring to FIG. 1 and the example illustrated in FIG. 8, the method 100 proceeds to step 107, where a plurality of openings are formed among the thermal dissipation features.

A plurality of openings 21 are formed to extend through the second etch stop layer 15 and the dielectric layer 14 so as to expose portions of the first etch stop layer 13. The openings 21 are disposed among the thermal dissipation features 20. In some embodiments, the openings 21 may be formed by the processes described above for forming the openings 19 with reference to FIGS. 5 and 6, and the details thereof are omitted for the sake of brevity.

Figure 9:
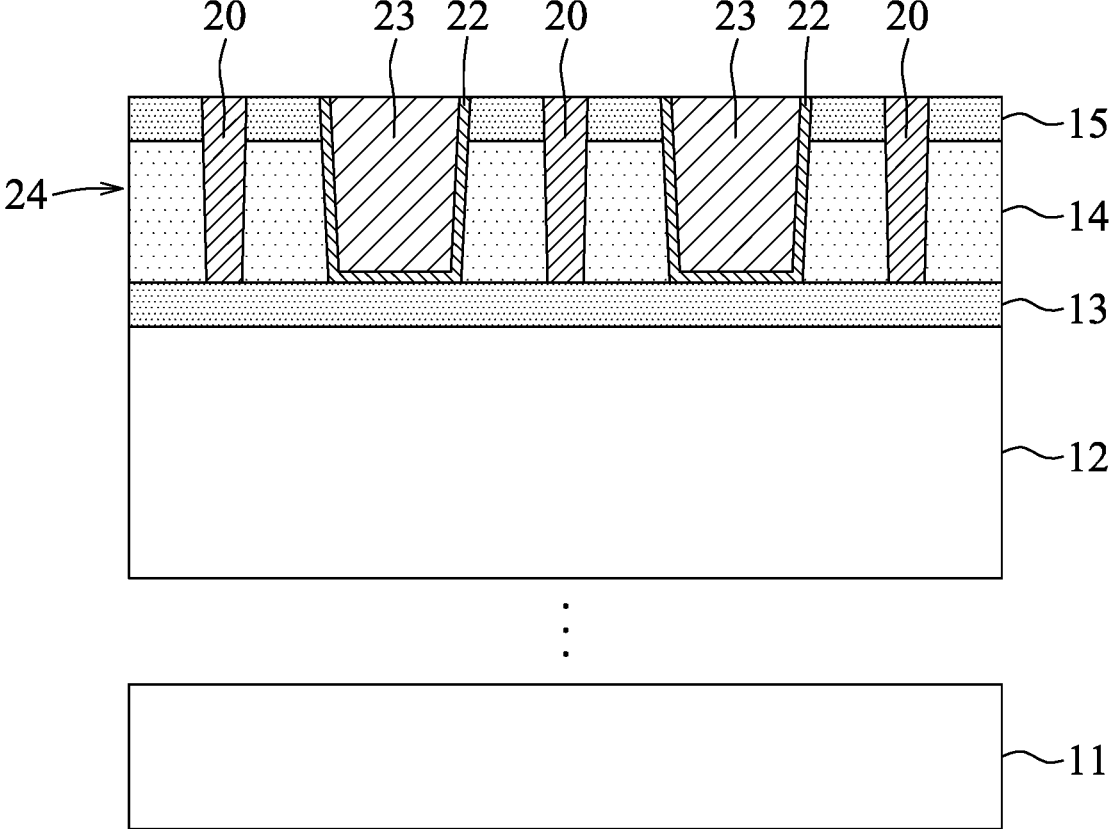

Referring to FIG. 1 and the example illustrated in FIGS. 8 and 9, the method 100 proceeds to step 108, where a plurality of liners and a plurality of interconnect structures are formed. A plurality of liners 22 are formed in the openings 21, respectively, and a plurality of interconnect structures 23 are formed on the liners 22, respectively. In some embodiments, the liners 22 may include, for example, but not limited to, cobalt (Co), ruthenium (Ru), tantalum (Ta), titanium (Ti), cobalt nitride (CoN), ruthenium nitride (RuN), tantalum nitride (TaN), titanium nitride (TiN), or the like, or combinations thereof. Other suitable liner materials are within the contemplated scope of the present disclosure. In some embodiments, the liners 22 may be formed by conformally depositing a liner layer using a suitable deposition process as is known in the art of semiconductor fabrication, such as PVD, CVD, ALD, PEALD, thermal ALD, PECVD, or the like, and then removing excess of the liner layer over the second etch stop layer 15 by a planarization process (for example, but not limited to, CMP process, or the like). A metal material is then filled into the remaining volume of each of the openings 21 by a suitable deposition process as is known to those skilled in the art of semiconductor fabrication (for example, but not limited to, CVD, PECVD, ALD, PEALD, PVD, ELD, ECP, or the like) at a temperature ranging from about 200° C. to about 450° C., and a planarization process (for example, but not limited to, a CMP process) is then conducted to remove excess of the metal material over the second etch stop layer 15 so as to form the interconnect structures 23. In some embodiments, the metal material may include, for example, but not limited to, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), molybdenum (Mo), or the like, or alloys thereof, which have good conductivity. Other suitable conductive materials are within the contemplated scope of the present disclosure. An interconnect layer 24 is thus formed on the interconnect layer 12. In some embodiments, the interconnect layer 24 may serve as a metal layer, and the interconnect structures 23 may serve as metal lines.

Figure 10:
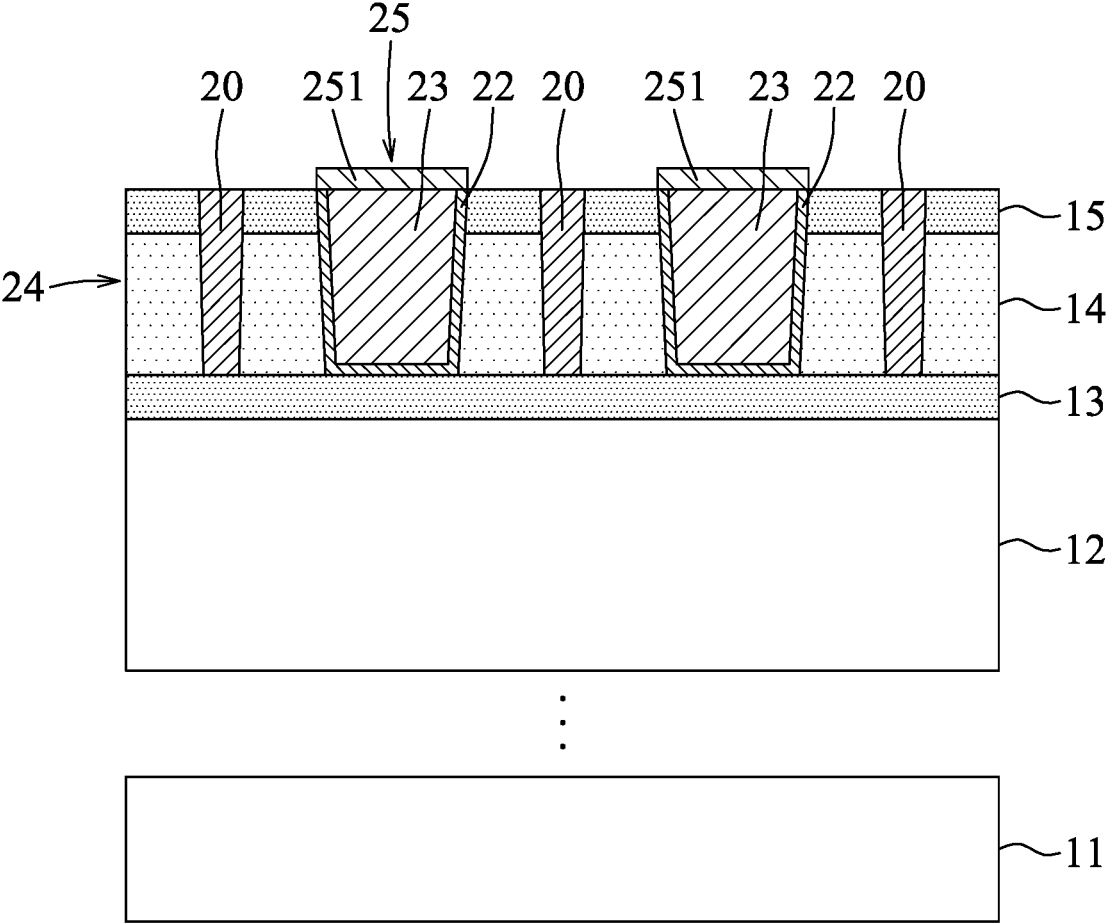

Referring to FIG. 1 and the example illustrated in FIG. 10, the method 100 proceeds to step 109, where a capping layer is selectively formed on the interconnect structures and the liners. FIG. 10 is a schematic view illustrating selective formation of a capping layer 25 on the interconnect structures 23 and the liners 22. The capping layer 25 includes a plurality of capping portions 251, each of which is deposited on a corresponding one of the interconnect structures 23 and a corresponding one of the liners 22. The capping layer 25 may be selectively formed on the interconnect structures 23 and the liners 22 by a suitable selective deposition process as is known to those skilled in the art of semiconductor fabrication, for example, but no limited to, selective CVD, selective ALD, selective electroless deposition (ELD), or the like. Other suitable techniques are within the contemplated scope of the present disclosure. In some embodiments, the capping layer 25 may include, for example, but not limited to, graphene, metal (for example, but not limited to, Co, Al, Ru, W, Mo, Ta, Cu, Fe, Rh, Ir, Pd, Pt, or the like), alloys of the metals, silicides, nitrides, or oxides of the metals or alloys thereof. Other suitable materials are within the contemplated scope of the present disclosure.

Thereafter, another interconnect layer (not shown) may be formed on the interconnect layer 24. The another interconnect layer may serve as a via layer and includes an interconnect structure, which serves as a via contact and which extends through an IMD layer (not shown) of the another interconnect layer so as to be electrically connected to a corresponding one of the interconnect structures 23 of the interconnect layer 24 through a corresponding one of the capping portions 251.

Referring to the example illustrated in FIG. 9, a semiconductor device in accordance with some embodiments of the present disclosure includes the interconnect layer 24 disposed on the interconnect layer 12. The interconnect layer 24 includes the dielectric layer 14 serving as an IMD layer; the first etch stop layer 13 disposed on a lower surface of the dielectric layer 14; the second etch stop layer 15 disposed on an upper surface of the dielectric layer 14; a plurality of the interconnect structures 23 extending downwardly through the second etch stop layer 15 and the dielectric layer 14 and spaced apart from each other; a plurality of the liners 22 each covering a bottom surface and a lateral surface of a corresponding one of the interconnect structures 23; and a plurality of the thermal dissipation features 20 extending downwardly through the second etch stop layer 15 and the dielectric layer 14 to be in contact with the first etch stop layer 13. As described above, the dielectric layer 14 includes a low-k dielectric material which includes silicon carbonitride ($SiC_xN_y$) having a high carbon content that ranges from about 30 atomic % to about 45 atomic %. The dielectric layer 14 may have a reduced etching damage, or even may be substantially free of etching damage, after being subjected to the etch process to form the openings 19 as illustrated in FIGS. 5 and 6. The k value of the dielectric layer 14 will not be undesirably increased after the etch process, or may be maintained substantially at the same value before and after the etch process. In addition, a breakdown field (Ebd) of the dielectric layer 14 may be maintained substantially at the same value before and after the etch process. Therefore, the capacitance of the IMD layer (i.e., the dielectric layer 14) formed in the interconnect layer 24 of the configuration shown in FIG. 9 will not be undesirably increased due to the etch process for forming the openings 19 as illustrated in FIG. 6.

In addition, as described above, the first etch stop layer 13 and the second etch stop layer 15 may include aluminum nitride (AlNx) which has a high thermal conductivity ranging from about 150 W/mK to about 200 W/mK. The first etch stop layer 13 and the second etch stop layer 15 may cooperate with the thermal dissipation features 20 to form a thermal dissipation structure, which includes an upper thermal dissipation layer (i.e., the second etch stop layer 15) disposed on an upper surface of the IMD layer (i.e., the dielectric layer 14), a lower thermal dissipation layer (i.e., the first etch stop layer 13) disposed on a lower surface of the IMD layer, and a plurality of the thermal dissipation features 20 disposed to interconnect the upper thermal dissipation layer and the lower thermal dissipation layer. Therefore, heat produced in the semiconductor device, especially in a back-end-of-line (BEOL) structure of the semiconductor device, can be dissipated easily through the thermal dissipation structure. Therefore, thermal-related reliability issues which may be caused by heat accumulation in the BEOL structure of the semiconductor device can be avoided.

Figure 11:
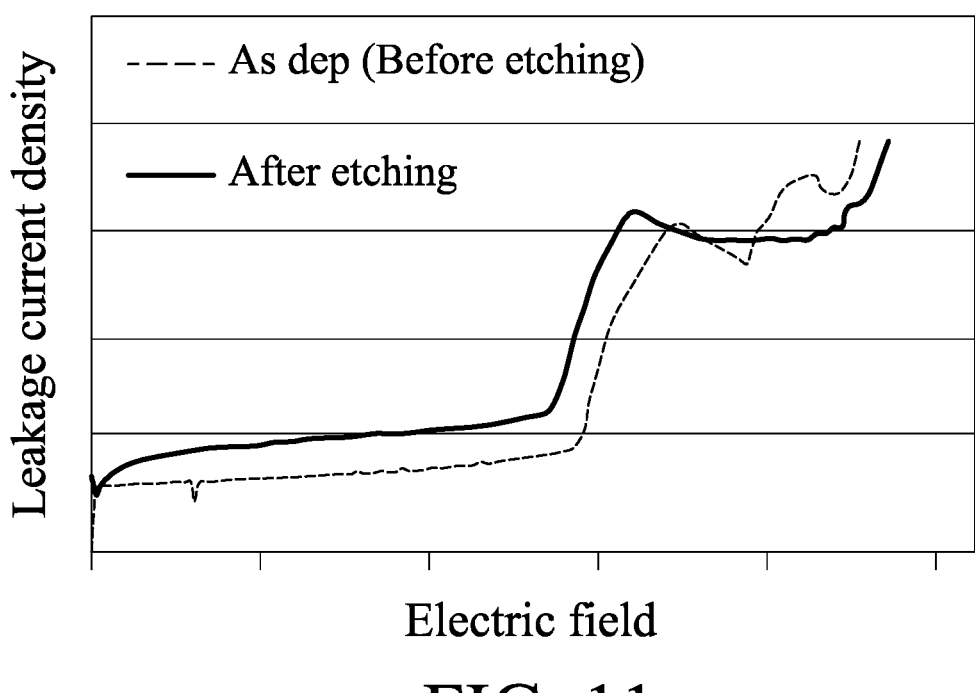
FIG. 11 is a graph showing leakage current density versus electric field of a dielectric layer including silicon carboxide (SiCxOy) before and after dry and wet etching processes.

FIG. 11 is a graph showing leakage current density versus electric field of a dielectric layer including silicon carboxide (SiCxOy) before and after a dry etching process and a wet etching process. As shown in FIG. 11, after the dielectric layer including silicon carboxide (SiCxOy) is subjected to the dry and wet etching processes, the leakage current density thereof is increased and the breakdown field (Ebd) thereof is decreased compared with the leakage current density and the breakdown field thereof before the dry and wet etching processes. In addition, after the dielectric layer including silicon carboxide (SiCxOy) is subjected to the dry and wet etching processes, the k value thereof is increased by a value ranging from about 5.0% to about 7.0% compared with the k value thereof before the dry and wet etching processes.

Figure 12:
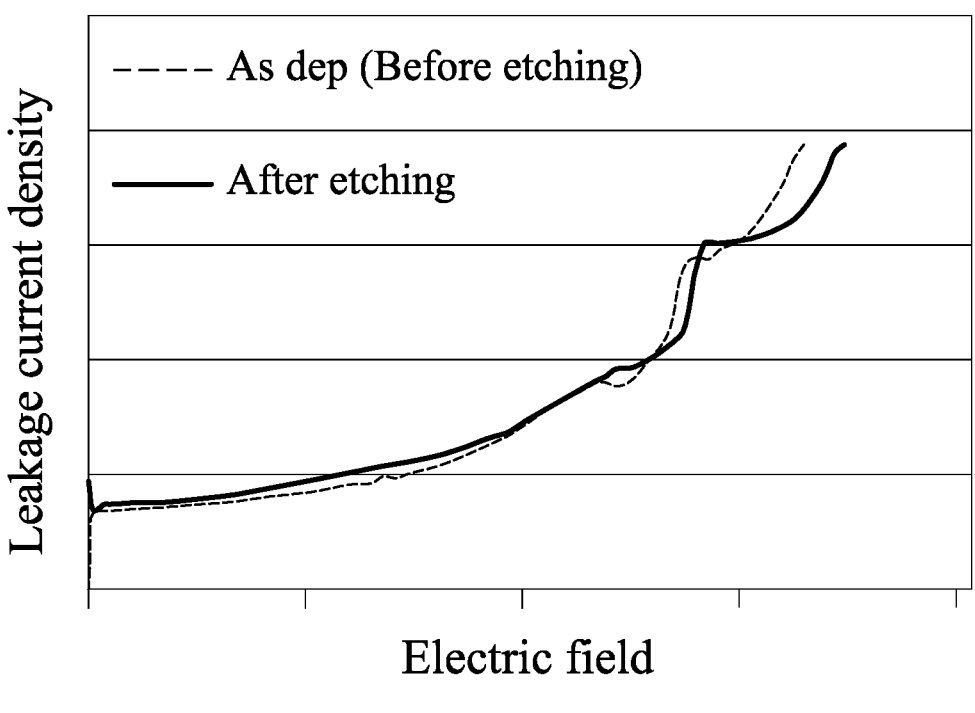
FIG. 12 is a graph showing leakage current density versus electric field of a dielectric layer including silicon carbonitride (SiCxNy) before and after dry and wet etching processes.

FIG. 12 is a graph showing leakage current density versus electric field of a dielectric layer including silicon carbonitride (SiCxNy) before and after a dry etching process and a wet etching process. As shown in FIG. 12, after the dielectric layer including silicon carbonitride (SiCxNy) is subjected to the dry and wet etching processes, the leakage current density and the breakdown field (Ebd) thereof are maintained substantially at the same level compared with the leakage current density and the breakdown field thereof before the dry and wet etching processes. In addition, after the dielectric layer including silicon carbonitride (SiCxNy) is subjected to dry and wet etching processes, the k value thereof is increased by a value ranging from about 1.0% to about 1.5% compared with the k value thereof before the dry and wet etching processes. These results demonstrate that after being subjected to the dry and wet etching processes, the increase of the k value of the dielectric layer including silicon carbonitride (SiCxNy) is substantially less than that of the k value of the dielectric layer including silicon carboxide (SiCxOy). Therefore, as described above, in the interconnect structure 24 of the configuration illustrated in FIG. 9, the dielectric layer 14, which includes silicon carbonitride (SiCxNy), may have a reduced etching damage, or even may be substantially free of etching damage, after being subjected to the etch process to form the openings 19 as illustrated in FIGS. 5 and 6. The k value of the dielectric layer 14 will not be undesirably increased after the etch process, or may be maintained at substantially the same value before and after the etch process. In addition, a breakdown field (Ebd) of the dielectric layer 14 may be maintained at substantially the same value before and after the etch process Therefore, the capacitance of the IMD layer (i.e., the dielectric layer 14) formed in the interconnect layer 24 of the configuration illustrated in FIG. 9 will not be undesirably increased due to the etch process for forming the openings 19.

In a semiconductor device of the present disclosure, a low-k dielectric material including silicon carbonitride (SiCxNy) having a carbon content ranging from about 30 atomic % to about 45 atomic % is used to form an intermetal dielectric (IMD) layer of an interconnect layer. The IMD layer formed by subjecting the low-k dielectric material to an etching process may have a reduced etching damage, or even may be substantially free of etching damage. Therefore, the k value of the IMD layer will not be undesirably increased after the etch process, and a breakdown field (Ebd) of the IMD layer may be maintained substantially at the same value before and after the etch process. The capacitance of the IMD layer will not be undesirably increased due to the etch process. In addition, a thermal dissipation feature having a high thermal conductivity is formed in the IMD layer and may cooperate with an etch stop layer having a high thermal conductivity to form a thermal dissipation structure. Therefore, heat produced in the semiconductor device, especially in a back-end-of-line (BEOL) structure of the semiconductor device, can be dissipated easily through the thermal dissipation structure. Therefore, thermal-related reliability issues which may be caused by heat accumulation in the BEOL structure of the semiconductor device can be avoided.

In accordance with some embodiments of the present disclosure, a semiconductor device includes a substrate, a dielectric layer disposed over the substrate, and an interconnect structure extending through the dielectric layer. The dielectric layer includes a low-k dielectric material which includes silicon carbonitride having a carbon content ranging from about 30 atomic % to about 45 atomic %

In accordance with some embodiments of the present disclosure, the semiconductor device further includes a thermal dissipation feature extending through the dielectric layer and disposed to be spaced apart from the interconnect structure. The thermal dissipation feature includes a thermal conductive dielectric material which has a thermal conductivity ranging from about 1 W/mK to about 2 W/mK.

In accordance with some embodiments of the present disclosure, the thermal conductive dielectric material includes silicon oxide.

In accordance with some embodiments of the present disclosure, the semiconductor device further includes a first etch stop layer disposed on a lower surface of the dielectric layer such that the thermal dissipation feature is in contact with the first etch stop layer. The first etch stop layer has a thermal conductivity ranging from about 150 W/mK to about 200 W/mK.

In accordance with some embodiments of the present disclosure, the semiconductor device further includes a second etch stop layer disposed on an upper surface of the dielectric layer such that the thermal dissipation feature extends through and is in contact with the second etch stop layer. The second etch stop layer has a thermal conductivity ranging from about 150 W/mK to about 200 W/mK.

In accordance with some embodiments of the present disclosure, the first etch stop layer includes aluminum nitride.

In accordance with some embodiments of the present disclosure, the second etch stop layer includes aluminum nitride.

In accordance with some embodiments of the present disclosure, the dielectric layer has a thermal conductivity ranging from about 0.6 W/mK to about 1.0 W/mK.

In accordance with some embodiments of the present disclosure, a semiconductor device includes a substrate, a dielectric layer disposed over the substrate, an interconnect structure extending through the dielectric layer, and a thermal dissipation structure. The dielectric layer includes a low-k dielectric material which includes silicon carbonitride having a carbon content ranging from about 30 atomic % to about 45 atomic %. The thermal dissipation structure includes a thermal dissipation feature which extends through the dielectric layer and which is disposed to be spaced apart from the interconnect structure. The thermal dissipation feature includes a thermal conductive dielectric material having a thermal conductivity ranging from about 1 W/mK to about 2 W/mK.

In accordance with some embodiments of the present disclosure, the thermal conductive dielectric material includes silicon oxide.

In accordance with some embodiments of the present disclosure, the thermal dissipation structure further includes a lower thermal dissipation layer disposed on a lower surface of the dielectric layer such that the thermal dissipation feature is in contact with the lower thermal dissipation layer. The lower thermal dissipation layer has a thermal conductivity ranging from about 150 W/mK to about 200 W/mK.

In accordance with some embodiments of the present disclosure, the thermal dissipation structure further includes an upper thermal dissipation layer disposed on an upper surface of the dielectric layer such that the thermal dissipation feature extends through and is in contact with the upper thermal dissipation layer. The upper thermal dissipation layer has a thermal conductivity ranging from about 150 W/mK to about 200 W/mK.

In accordance with some embodiments of the present disclosure, the lower thermal dissipation layer includes aluminum nitride.

In accordance with some embodiments of the present disclosure, the upper thermal dissipation layer includes aluminum nitride.

In accordance with some embodiments of the present disclosure, the dielectric layer has a thermal conductivity ranging from about 0.6 W/mK to about 1.0 W/mK.

In accordance with some embodiments of the present disclosure, the dielectric layer has a k-value ranging from about 2.5 to about 4.0.

In accordance with some embodiments of the present disclosure, a method for manufacturing a semiconductor device includes: forming a dielectric layer over a substrate using a low-k dielectric material which includes silicon carbonitride having a carbon content ranging from about 30 atomic % to about 45 atomic %; and forming an interconnect structure to extend through the dielectric layer.

In accordance with some embodiments of the present disclosure, the method for manufacturing a semiconductor device further includes forming a thermal dissipation feature using a thermal conductive dielectric material having a thermal conductivity ranging from about 1 W/mK to about 2 W/mK, such that the thermal dissipation feature extends through the dielectric layer and is disposed to be spaced apart from the interconnect structure.

In accordance with some embodiments of the present disclosure, the method for manufacturing a semiconductor device further includes forming a lower thermal dissipation layer having a thermal conductivity ranging from about 150 W/mK to about 200 W/mK on a lower surface of the dielectric layer such that the thermal dissipation feature is in contact with the lower thermal dissipation layer.

In accordance with some embodiments of the present disclosure, the method for manufacturing a semiconductor device further includes forming an upper thermal dissipation layer having a thermal conductivity ranging from about 150 W/mK to about 200 W/mK on an upper surface of the dielectric layer such that the thermal dissipation feature extends through and is in contact with the upper thermal dissipation layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   - forming a lower thermal dissipation layer over a substrate;
   - subjecting the lower thermal dissipation layer to a plasma treatment so as to convert the lower thermal dissipation layer from a polycrystalline state to a single crystalline state;
   - forming a dielectric layer on the lower thermal dissipation layer using a low-k dielectric material which includes silicon carbonitride having a carbon content ranging from 30 atomic % to 45 atomic %; and
   - forming an interconnect structure to extend through the dielectric layer.

2. The method according to claim 1, further comprising forming a thermal dissipation feature using a thermal conductive dielectric material having a thermal conductivity ranging from 1 W/mK to 2 W/mK, such that the thermal dissipation feature extends through the dielectric layer and is disposed to be spaced apart from the interconnect structure.

3. The method according to claim 2, wherein the lower thermal dissipation layer has a thermal conductivity ranging from 150 W/mK to 200 W/mK, and the thermal dissipation feature is in contact with the lower thermal dissipation layer.

4. The method according to claim 3, further comprising forming an upper thermal dissipation layer having a thermal conductivity ranging from 150 W/mK to 200 W/mK on an upper surface of the dielectric layer such that the thermal dissipation feature extends through and is in contact with the upper thermal dissipation layer.

5. The method according to claim 4, wherein one of the lower thermal dissipation layer and the upper thermal dissipation layer includes aluminum nitride.

6. The method according to claim 5, wherein the one of the lower thermal dissipation layer and the upper thermal dissipation layer is formed by chemical vapor deposition or atomic layer deposition using a first precursor containing aluminum and a second precursor containing nitrogen.

7. The method according to claim 6, wherein the first precursor includes trimethyl aluminum, triethyl aluminum, or a combination thereof.

8. The method according to claim 6, wherein the second precursor includes nitrogen gas, ammonia, or a combination thereof.

9. The method according to claim 2, wherein the thermal conductive dielectric material includes silicon oxide.

10. The method according to claim 1, wherein the dielectric layer is formed by a deposition process using a first precursor containing silicon and carbon and a second precursor containing nitrogen.

11. The method according to claim 10, wherein the first precursor includes methylsilane, dimethylsilane, trimethylsilane, tetramethylsilane, methyldisilane, dimethyldisilane, trimethyldisilane, tetramethyldisilane, pentamethyldisilane, hexamethyldisilane, or combinations thereof.

12. The method according to claim 10, wherein the second precursor includes nitrogen gas, ammonia, or a combination thereof.

13. The method according to claim 1, wherein the dielectric layer is formed by a deposition process using a silicon-containing precursor, a carbon-containing precursor, and a nitrogen-containing precursor.

14. The method according to claim 13, wherein the silicon-containing precursor includes silane, disilane, or a combination thereof.

15. The method according to claim 13, wherein the carbon-containing precursor includes ethylene.

16. The method according to claim 13, wherein the nitrogen-containing precursor includes nitrogen gas, ammonia, or a combination thereof.

17. A method for manufacturing a semiconductor device, comprising:

sequentially forming a first etch stop layer, a dielectric layer, and a second etch stop layer over a substrate, wherein the dielectric layer is formed using a low-k dielectric material which includes silicon carbonitride having a carbon content ranging from 30 atomic % to 45 atomic %, and wherein one of the first etch stop layer and the second stop layer has a thermal conductivity ranging from 150 W/mK to 200 W/mK;

forming a thermal dissipation feature using a thermal conductive dielectric material having a thermal conductivity ranging from 1 W/mK to 2 W/mK, such that the thermal dissipation feature extends through the second etch stop layer and the dielectric layer to terminate at the first etch stop layer; and forming an interconnect structure to extend through the second etch stop layer and the dielectric layer to terminate at the first etch stop layer and to be spaced apart from the thermal dissipation feature, wherein an interface formed between the thermal dissipation feature and the first etch stop layer is flush with an interface formed between the dielectric layer and the first etch stop layer.

18. The method according to claim 17, further comprising: subjecting the first etch stop layer to a plasma treatment so as to convert the first etch stop layer from a polycrystalline state to a single crystalline state.

19. A method for manufacturing a semiconductor device, comprising:

sequentially forming a first etch stop layer, a dielectric layer, and a second etch stop layer over a substrate, wherein the dielectric layer is formed using a low-k dielectric material which includes silicon carbonitride having a carbon content ranging from 30 atomic % to 45 atomic %, and wherein one of the first etch stop layer and the second stop layer has a thermal conductivity ranging from 150 W/mK to 200 W/mK;

subjecting the one of the first etch stop layer and the second stop layer to a plasma treatment so as to convert the one of the first etch stop layer and the second stop layer from a polycrystalline state to a single crystalline state;

forming a thermal dissipation feature using a thermal conductive dielectric material having a thermal conductivity ranging from 1 W/mK to 2 W/mK, such that the thermal dissipation feature extends through the second etch stop layer and the dielectric layer to terminate at the first etch stop layer'; and forming an interconnect structure to extend through the second etch stop layer and the dielectric layer to terminate at the first etch stop layer and to be spaced apart from the thermal dissipation feature.

20. The method according to claim 19, wherein the one of the first etch stop layer and the second stop layer includes aluminum nitride; and the plasma treatment is processed using an inert gas plasma which includes helium plasma, argon plasma, or a combination thereof.

* * * * *